United States Patent
Choi et al.

[11] Patent Number: 5,920,777
[45] Date of Patent: Jul. 6, 1999

[54] SEMICONDUCTOR MEMORY DEVICE AND METHOD OF MANUFACTURING THE SAME

[75] Inventors: Jong Mun Choi, Seoul; Chang Yeol Kim, Cheongju-si, both of Rep. of Korea

[73] Assignee: LG Semicon Co., Ltd., Chung Cheong Buk-Do, Rep. of Korea

[21] Appl. No.: 09/111,287

[22] Filed: Jul. 7, 1998

Related U.S. Application Data

[62] Division of application No. 08/561,477, Nov. 21, 1995, Pat. No. 5,821,579.

[30] Foreign Application Priority Data

Nov. 21, 1994 [KR] Rep. of Korea ........... 94-30587

[51] Int. Cl.⁶ ............................................. H01L 21/336
[52] U.S. Cl. .................... 438/257; 438/239; 438/243; 438/254; 438/386
[58] Field of Search ................... 438/239, 243, 438/244, 249, 254, 257, 386; 257/302

[56] References Cited

U.S. PATENT DOCUMENTS

| | | | |
|---|---|---|---|
| 5,214,296 | 5/1993 | Nakata et al. | 257/302 |
| 5,216,266 | 6/1993 | Ozaki | 257/302 |
| 5,281,837 | 1/1994 | Kohyama | 257/301 |
| 5,336,917 | 8/1994 | Kohyama | 257/296 |
| 5,519,236 | 5/1996 | Ozaki | 257/302 |

*Primary Examiner*—Peter Toby Brown
*Assistant Examiner*—Khanh Duong
*Attorney, Agent, or Firm*—Loudermilk & Associates

[57] ABSTRACT

A semiconductor memory device including a semiconductor substrate having a trench; a dielectric film formed on the substrate; a storage node electrode formed on the dielectric film; a first insulating film formed on the storage node electrode corresponding to the trench; a gate electrode formed on the first insulating film; a second insulating film formed on the gate electrode; a gate insulating film formed on at least one the side of gate electrode; a semiconductor layer formed on the at least one side of the first and second insulating films; and impurity regions formed in the semiconductor layer at the sides of the first and second insulating films. A manufacturing method including the steps of etching a semiconductor substrate to form a trench; forming a dielectric film and a conductive layer on the substrate; forming a first insulating film, a gate electrode, a second insulating film, and an interconnection layer, on the conductive layer corresponding to the trench; forming a semiconductor layer on the sides of the first and second insulating films; etching the conductive layer to form a storage node; and forming an impurity region in the semiconductor layer at the sides of the first and second insulating films.

3 Claims, 7 Drawing Sheets

SEMICONDUCTOR MEMORY DEVICE AND METHOD OF MANUFACTURING THE SAME

This application is a divisional of application Ser. No. 08/561,477 filed on Nov. 21, 1995 now U.S. Pat. No. 5,821,579.

FIELD OF THE INVENTION

The present invention relates to semiconductor memory devices, and more particularly to dynamic random access memories (DRAMs) suitable for highly integrated devices and methods of manufacturing the same.

BACKGROUND OF THE INVENTION

Figure 1:
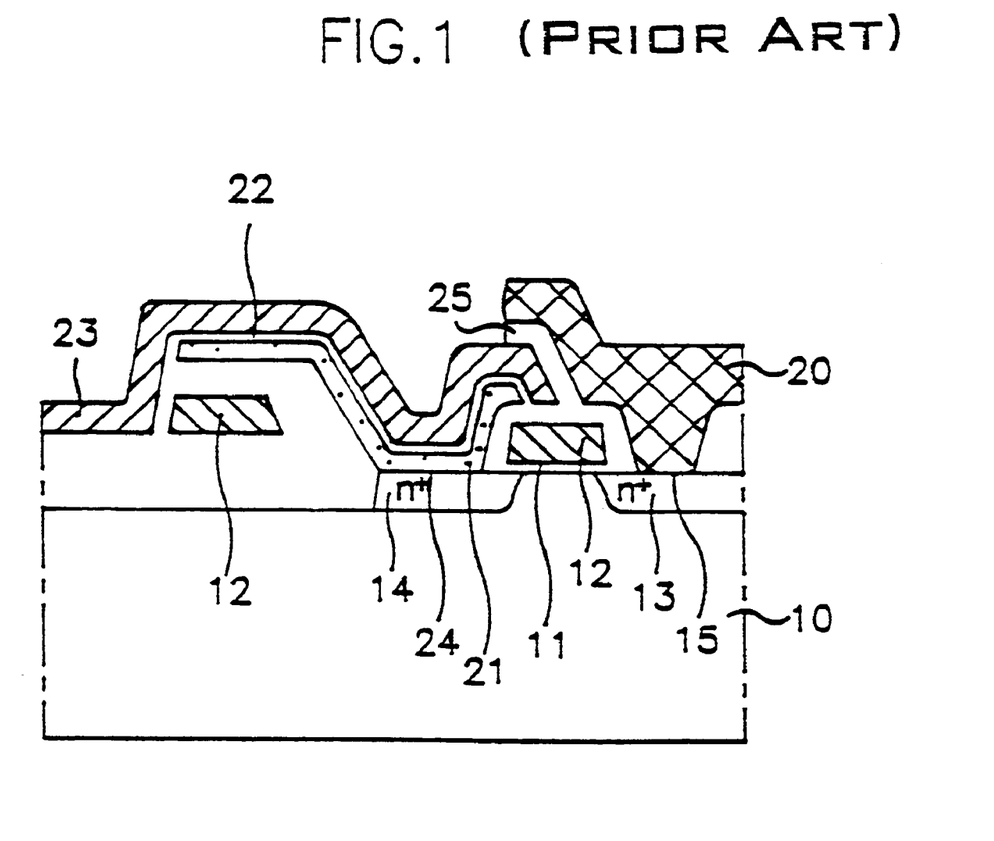
FIG. 1 is a cross-sectional view illustrating the structure of a conventional DRAM cell.

The structure of a DRAM cell according to a conventional method is illustrated in FIG. 1.

Referring to FIG. 1, a conventional DRAM cell having a stacked capacitor structure is largely comprised of silicon substrate 10, a transfer transistor, a stacked capacitor, and bitline 20. The transfer transistor has a planar structure including gate insulating film 11 formed on substrate 10, gate 12 which is formed on gate insulating film 11 and serves as a wordline, and source/drain regions 13 and 14 formed on both sides of gate 12 in substrate 10. The stacked capacitor has a planar structure including storage node 21 connected to drain region 14 of the transfer transistor through capacitor contact 24, capacitor dielectric film 22 formed on storage node 21, and plate node 23 formed on capacitor dielectric film 22. Bitline 20 is connected to source region 13 of the transfer transistor through bitline contact 15. In FIG. 1, reference numeral 25 represents an interlayer insulating film.

A conventional DRAM cell has a structure in which bitline contact 15 and storage node contact 24 are arranged on silicon substrate 10 in a plane. Therefore, the cell area is wide, which is disadvantageous for higher integration devices.

Further, for isolating devices from each other in the conventional DRAM cell, an isolation film is formed using a local oxidation of silicon (LOCOS) or trench. This causes a problem in that the cell size is influenced by the isolation technique.

Moreover, as illustrated in FIG. 1, in the case where a stacked capacitor is used as the capacitor of the DRAM cell, a problem may result in that increased step differences of the cell are inevitably caused by the steps taken to increase the capacitance.

SUMMARY OF THE INVENTION

It is an object of the present invention to provide a semiconductor memory device favorable to higher integration and a method of manufacturing the same, in which a capacitor and a bitline are located on the same vertical line.

To accomplish the above object of the present invention, there is provided a semiconductor memory device comprising: a semiconductor substrate having a trench; a dielectric film formed on the substrate including the trench; a storage node electrode formed on the dielectric film; a first insulating film formed on the storage node electrode corresponding to the trench; a gate electrode formed on the first insulating film; a second insulating film formed on the gate electrode; a gate insulating film formed at least on one side of the gate electrode; a semiconductor layer formed on the sides of the first and second insulating films including the gate insulating film; and an impurity region formed in the semiconductor layer at the sides of the first and second insulating films.

Further, there is provided a method of manufacturing a semiconductor memory device, comprising the steps of: etching a semiconductor substrate to form a trench; forming a dielectric film and a conductive layer serving as a storage node, sequentially, on the substrate including the trench; forming a first insulating film, a gate electrode, a second insulating film, and an interconnection layer on the conductive layer corresponding to the trench; forming a semiconductor layer on the sides of the first and second insulating films including a gate insulating film; etching the conductive layer using the semiconductor layer and interconnection layer as masks to form a storage node; and forming an impurity region in the semiconductor layer at the sides of the first and second insulating films.

DETAILED DESCRIPTION OF THE INVENTION

Figure 2:
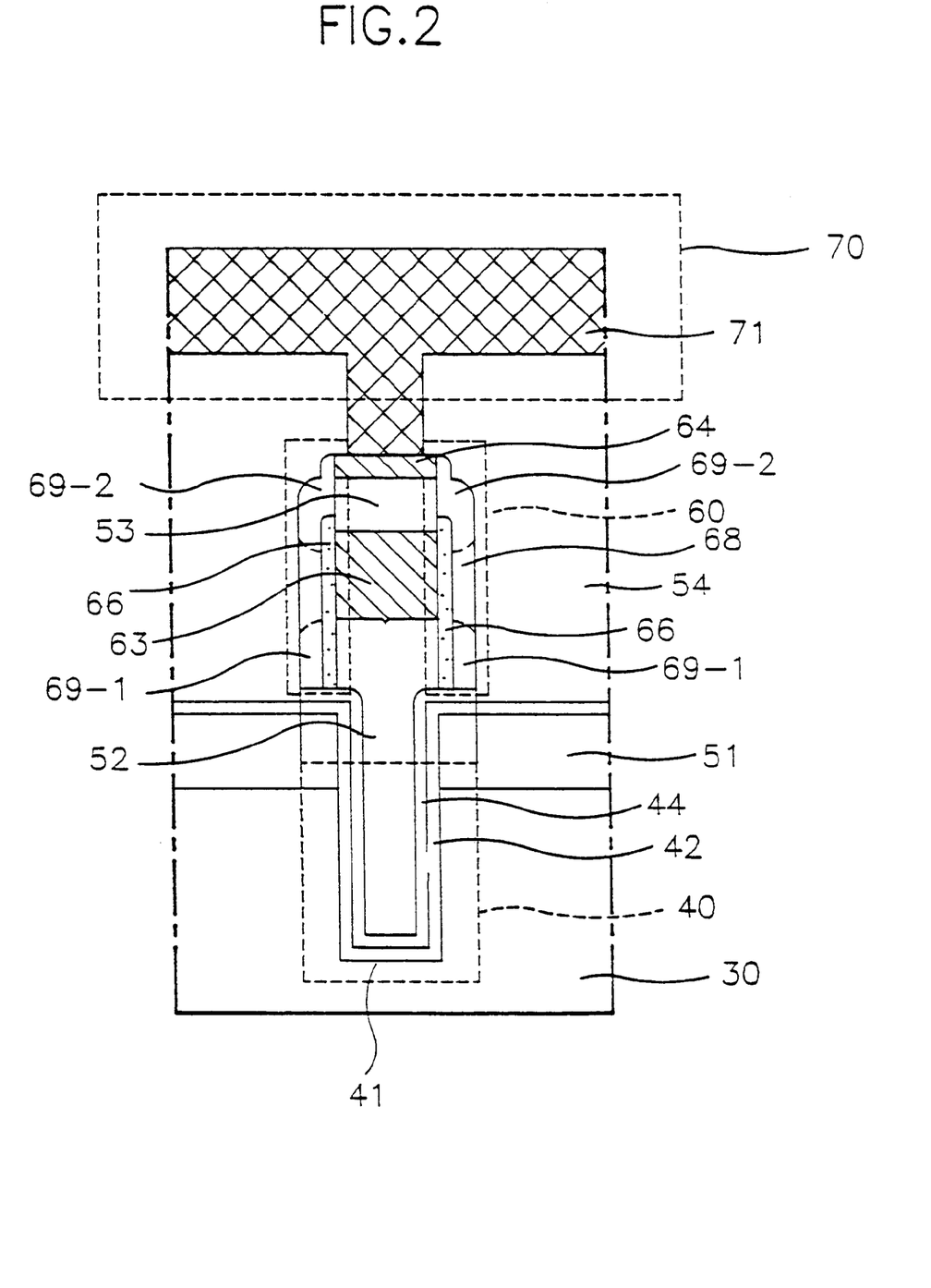
FIG. 2 is a cross-sectional view illustrating the structure of a DRAM cell according to a first embodiment of the present invention.

FIG. 2 illustrates a cross-sectional structure of a semiconductor memory device according to an embodiment of the present invention.

Referring to FIG. 2, a DRAM cell of the present invention is largely comprised of semiconductor substrate 30, capacitor portion 40, transfer transistor portion 60, and bitline portion 70. The DRAM cell of the present invention is constructed to have components arranged not on the semiconductor substrate on a plane, but instead arranged on a vertical line of the semiconductor substrate.

In other words, trench-type capacitor 40 is formed in a trench of semiconductor substrate 30. Transfer transistor 60 is formed on capacitor 40 in a self-aligned manner without a capacitor contact. Bitline portion 70 is formed on transfer transistor 60. Therefore, the DRAM cell of the present invention has a structure in which the components of the DRAM cell are arranged vertically.

The structure of a DRAM cell according to the present invention will be described below in more detail with reference to FIG. 2.

First insulating film 51 is formed on semiconductor substrate 30, and trench 41 is formed in first insulating film 51 and semiconductor substrate 30.

Capacitor dielectric film 42 and storage node 44 are formed over insulating film 51 and including trench 41, thereby forming a capacitor. At this time, semiconductor substrate 30 underneath capacitor dielectric film 42 serves as a capacitor plate.

On trench 41, there is formed a stacked structure consisting of second insulating film 52 formed to a thickness as to be sufficient to fill the remaining portion of trench 41, and gate 63 serving as a wordline, third insulating film 53 and interconnection layer 64, sequentially formed on second insulating film 52 as illustrated.

Transfer transistor 60 is comprised of gate 63, which serves as a wordline and is part of the stacked structure, gate insulating film 66 formed in the form of a sidewall spacer on the sides of the stacked structure except interconnection layer 64, channel layer 68 formed in the form of a sidewall spacer on the sides of the stacked structure so as to include gate insulating film 66, and n+-type impurity regions 69-1 and 69-2 of high concentrations for use as source/drain regions, which are formed in both channel layers 68 at each side of gate 63 and connected to storage node 44 of capacitor 40 and bitline portion 70 via interconnection layer 64 as illustrated.

Bitline portion 70 consists of bitline 71 connected to interconnection layer 64 through a bitline contact.

FIGS. 3A to 3K illustrate a manufacturing sequences of a DRAM as illustrated in FIG. 2.

Figure 3A:
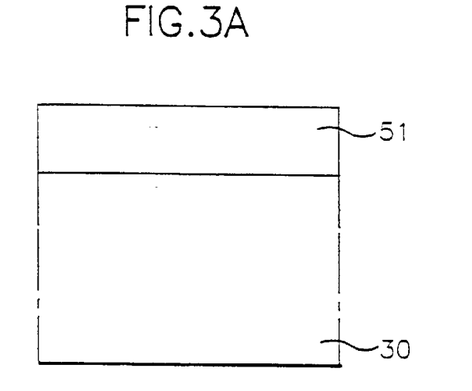
FIGS. 3A to 3K are cross-sectional views illustrating a method of manufacturing the DRAM illustrated in FIG. 2.
Figure 3B:
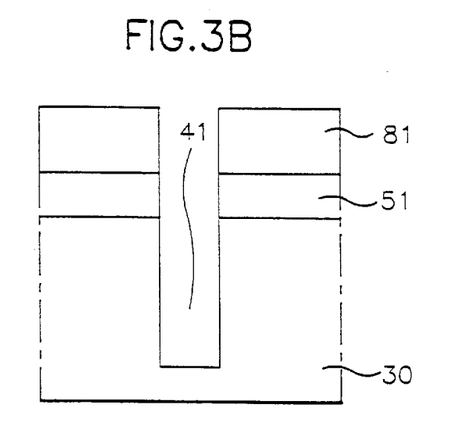

As illustrated in FIG. 3A, on p-type semiconductor substrate 30, an oxide film is formed as first insulating film 51. As illustrated in FIG. 3B, after coating photosensitive film 81 on first insulating film 51, photosensitive film 81 is etched so as to expose first insulating film 51 at a portion where a trench will be formed. The exposed portion of insulating film 51 is etched using photosensitive film 81 as a mask. Exposed substrate 30 is etched to form trench 41

At this time, before forming first insulating film 51 on semiconductor substrate 30, semiconductor substrate 30 is doped with p-type impurity ions so as to form a well (not shown), and trench 41 may be formed in the well.

Figure 3C:
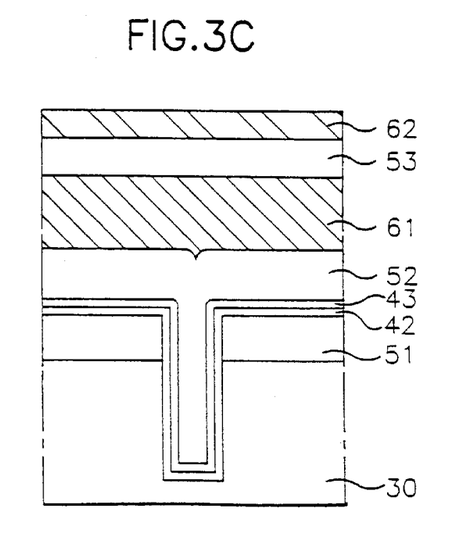

Referring to FIG. 3C, after removing photosensitive film 81, capacitor dielectric film 42 and first conductive layer 43 serving as a capacitor storage node are formed on the entire surface of first insulating film 51 and including trench 41. Successively, on first conductive layer 43, second insulating film 52 is formed to have a thickness sufficient to fill the trench and to provide a planarized surface. Second conductive layer 61 serving as a gate of a transfer transistor, third insulating film 53, and third conductive layer 62 for use as an interconnection layer are sequentially formed on second insulating film 52.

It is desirable that a nitride-oxide (NO) film is used as capacitor dielectric film 42 and an n+-type impurity-doped polysilicon film is used as first to third conductive layers 43, 61, and 62.

Figure 3D:
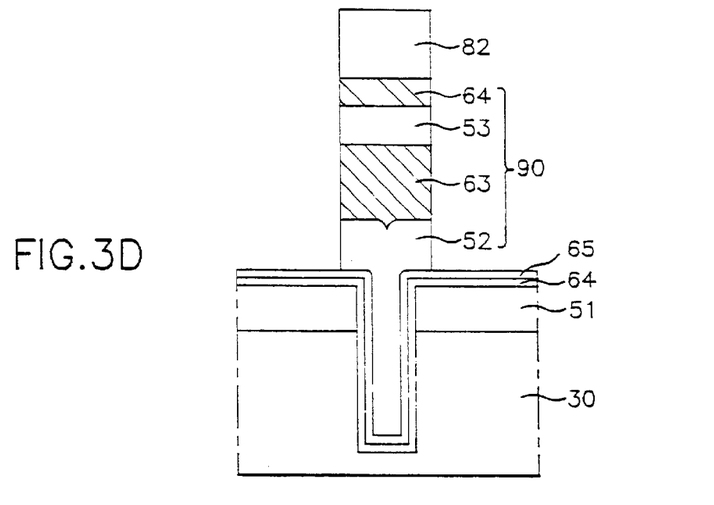

Referring to FIG. 3D, photosensitive film 82 is coated on third conductive layer 62, and photo-etched so as to remain only over the trench as illustrated.

The above stacked layers are etched using photosensitive film 82 as a mask to form stacked structure 90 having a pillar shape. In stacked structure 90, reference numeral 63 represents a gate of the transfer transistor. Reference numeral 64 represents an interconnection layer for connecting a drain of the transfer transistor and a bitline to each other, which will be formed in a subsequent process.

Figure 3E:
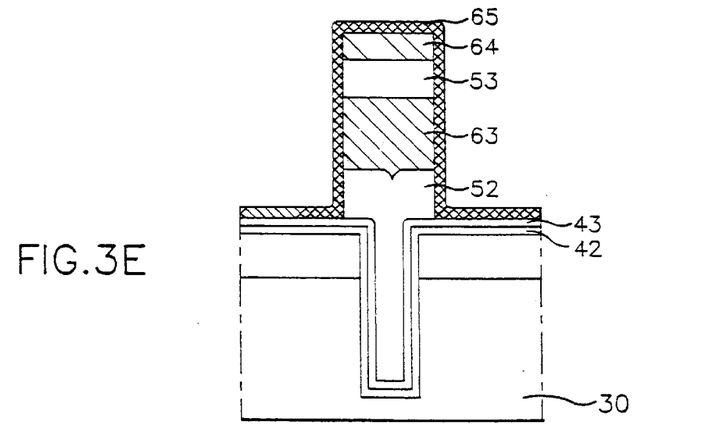
Figure 3F:
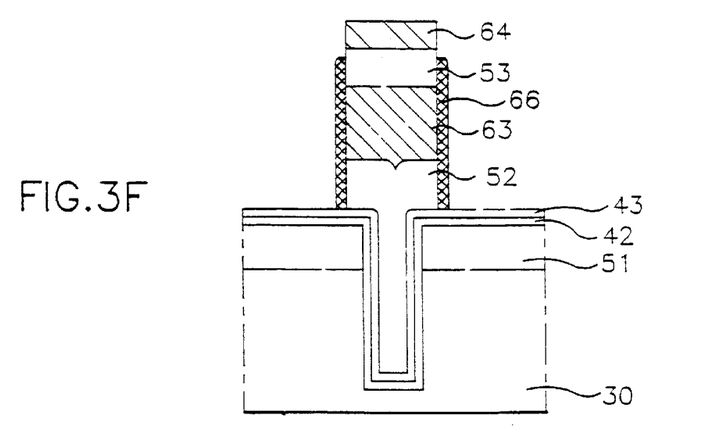

Referring to FIG. 3E, after removing photosensitive film 82, oxide film 65 for use as a gate insulating film is formed over the surface of first conductive layer 43 and over stacked structure 90. As illustrated in FIG. 3F, oxide film 65 is etched back, thereby forming gate insulating film 66 in the form of a sidewall spacer on one or both sides of stacked structure 90, excluding interconnection layer 64.

Figure 3G:
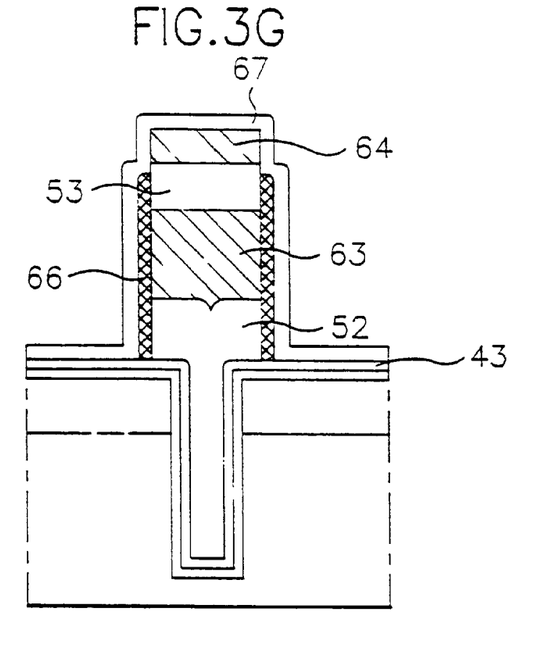
Figure 3H:
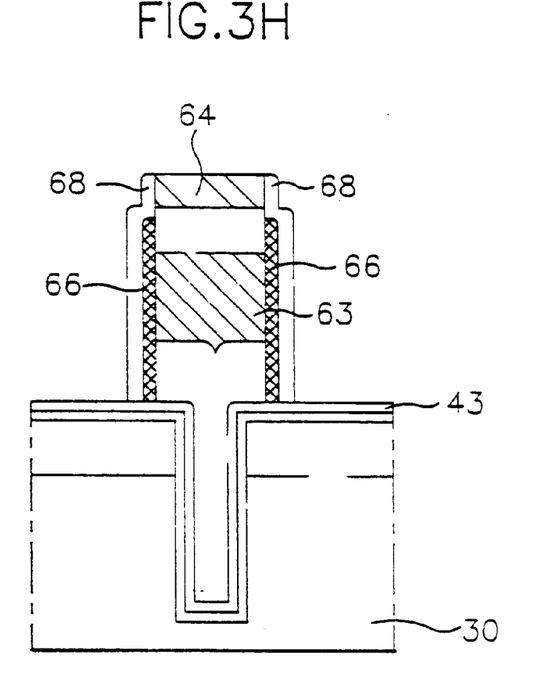

Referring to FIG. 3G, on the surface of first conductive layer 43 and over gate insulating film 66 and interconnection layer 64 as illustrated, fourth conductive layer 67 of crystalline silicon is formed. As illustrated in FIG. 3H, fourth conductive layer 67 is etched back, thereby forming channel layer 68 of the transfer transistor on both sides of stacked structure 90, in the form of a sidewall spacer.

Channel layer 68 is formed so as to cover gate insulating film 66 having the form of a sidewall spacer. Due to the formation of channel layer 68, the upper surfaces of interconnection layer 64 constituting stacked structure 90 and first conductive layer 43 are exposed.

Figure 3I:
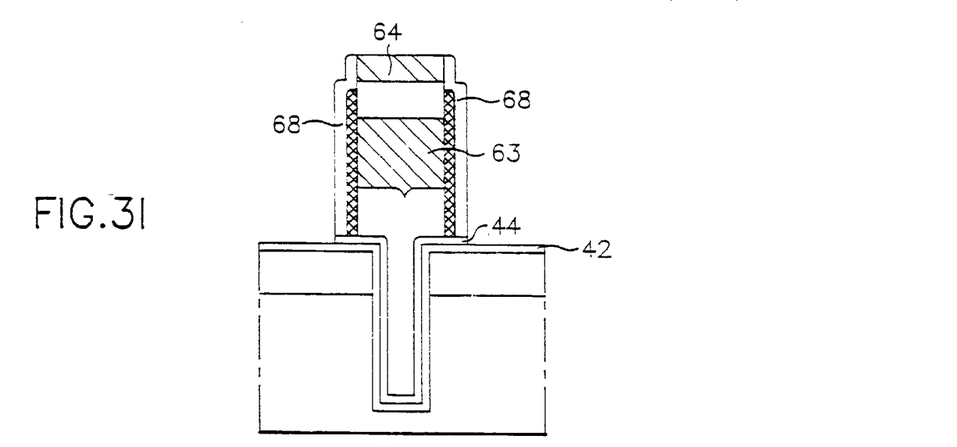

Referring to FIG. 3I, exposed first conductive layer 43 is etched using stacked structure 90 and channel layer 68 as masks, thereby forming capacitor storage node 44.

Figure 3J:
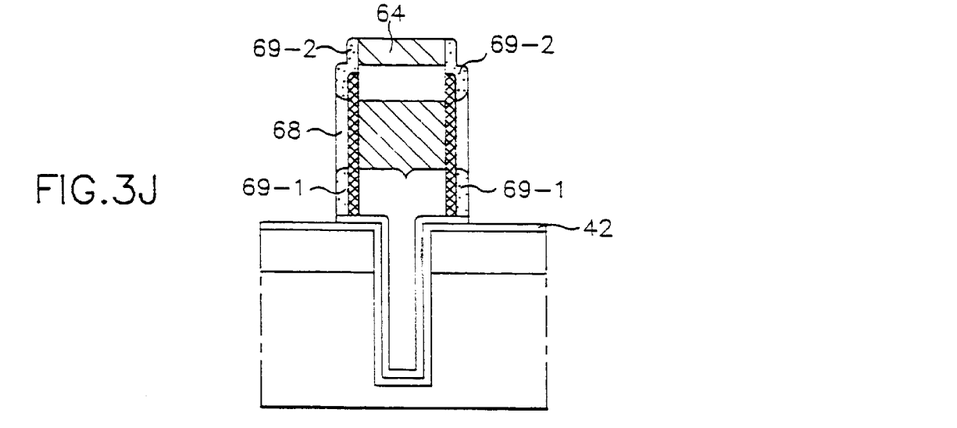

After forming storage node 44, a heat treatment process is performed. After the heat treatment process, as illustrated in FIG. 3J, n+-type impurity ions are imparted or diffused into channel layer 68 from interconnection layer 64 consisting of the n+-doped polysilicon film contacted with channel layer 68, thereby forming drain region 69-2 of transfer transistor 60 in channel layer 68 of one side of gate 63. Meanwhile, n+-impurity ions are imparted or diffused into channel layer 68 from storage node 44 consisting of the n+-doped polysilicon film directly contacted with channel layer 68, thereby forming source region 69-1 of transfer transistor in channel layer 68 at the other side of gate 63.

Therefore, channel layer 68 corresponding to the side of gate 63, where source/drain regions 69-1 and 69-2 are not formed, serves as the channel region of transfer transistor 60.

Figure 3K:
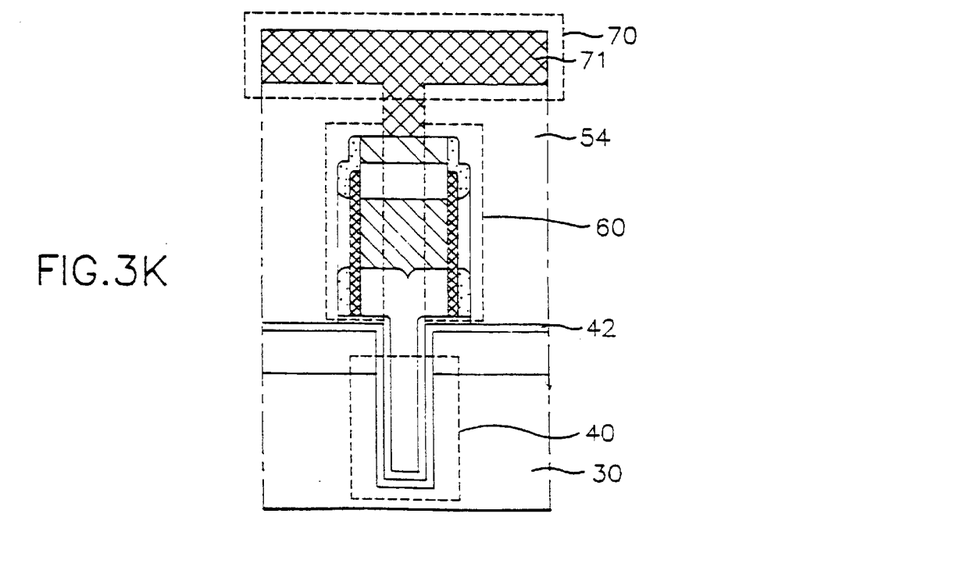

Referring to FIG. 3K, oxide film 54 of a borophosposilicate glass (BPSG) is deposited as a fourth insulating film, and selectively removed so as to expose the upper surface of interconnection layer 64, thereby forming a bitline contact.

Thereafter, a metal is deposited on the entire surface of the substrate and patterned, thereby forming bitline 71 connected to interconnection layer 64 through the bitline contact. As a result, a DRAM device according to this embodiment of the present invention is obtained.

Drain region 69-2 is connected to bitline 71 via interconnection layer 64, so that transfer transistor portion 60 is electrically connected to bitline portion 70. Source region 69-1 is connected to storage node 44, so that transfer transistor portion 60 is electrically connected to capacitor portion 40, and they are connected to each other in a self-aligned manner without an additional process for forming a storage node contact.

Figure 4:
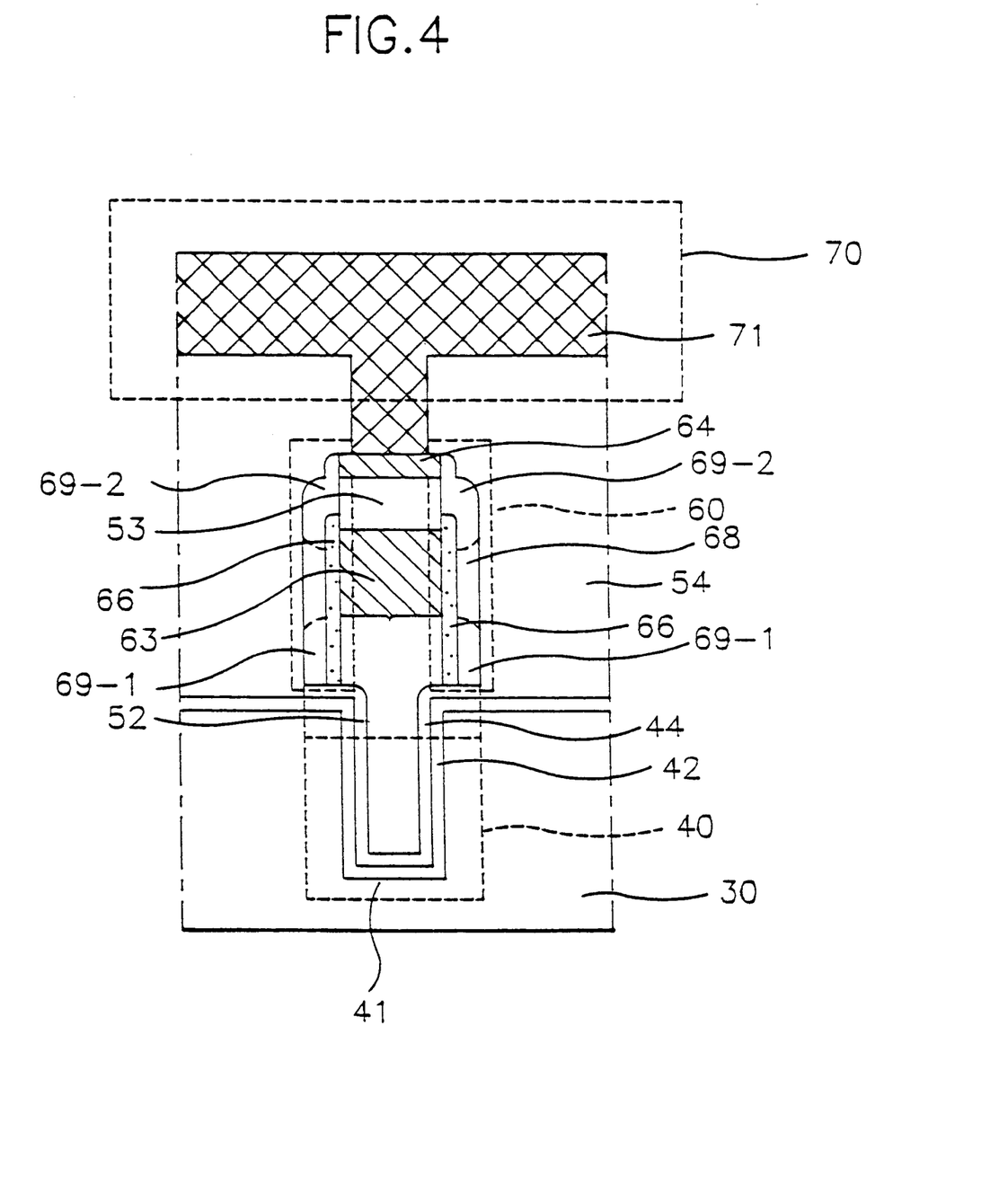
FIG. 4 is a cross-sectional view illustrating a structure of a DRAM cell according to a second embodiment of the present invention.

FIG. 4 illustrates a cross-sectional structure of a DRAM cell according to another embodiment of the present invention.

Referring to FIG. 4, as compared with the DRAM cell of the first embodiment illustrated in FIG. 2, a DRAM cell according to the second embodiment has a structure in which first insulating film 51 is not formed on substrate 40 and trench 41, and capacitor dielectric film 42 and storage node electrode 44 are directly formed on the substrate.

In a method of manufacturing the DRAM cell according to the second embodiment, photosensitive film 81 is directly coated on substrate 40 without forming first insulating film 51, and patterned to expose the substrate portion where the trench will be formed. Thereafter, the exposed substrate is etched using photosensitive film 81 as a mask to form trench 41. Dielectric film 42 is formed on substrate 40 including trench 41, and conductive layer 43 serving as a storage node is sequentially formed thereon.

Thereafter, the subsequent process is performed by a method as described previously in connection with the first embodiment illustrated in FIG. 3.

According to the present invention as described above, a capacitor constituting a DRAM device is formed with a trench structure, and transfer transistor and bitline are formed with stacked structures such that they are vertically located on the capacitor in a straight line. Therefore, an effect of reducing an occupied cell area in the same planar structure, which is an advantage obtained in the conventional stacked capacitor structure, can be secured. This is advantageous to higher integration.

Further, in the present invention, devices are isolated from each other using only a photo-etching process, requiring no device isolation technique such as a LOCOS isolation process. Moreover, source/drain regions are formed in a self-aligned manner, so that this invention has certain advantages over conventional methods.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method of manufacturing a semiconductor memory device, comprising the steps of:

etching a semiconductor substrate to form a trench;

forming a dielectric film and a conductive layer on the substrate and in the trench for a storage node;

forming a first insulating film, a gate electrode, a second insulating film and an interconnection layer on the conductive layer corresponding to the trench;

forming a gate insulating film beside the first insulating film, the gate electrode and the second insulating film;

forming a semiconductor layer over the gate insulating film;

etching the conductive layer using the semiconductor layer and interconnection layer as masks to form the storage node; and forming impurity regions in the semiconductor layer beside the first and second insulating films.

2. The method of claim 1, wherein after forming the impurity regions, the method further comprises the steps of:

forming a third insulating film over the substrate including the semiconductor layer and the interconnection layer;

etching the third insulating film over the interconnection layer to form a contact hole; and forming a bitline on the third insulating film, wherein the bitline is connected to the interconnection layer through the contact hole.

3. The method of claim 1, wherein in the step of forming the impurity regions, a heat treatment process is performed, wherein impurity ions diffuse from the storage node into the semiconductor layer beside the first insulating film, and impurity ions diffuse from the interconnection layer into the semiconductor layer beside the second insulating film.

* * * * *